(12) United States Patent
Tanaka

(10) Patent No.: US 12,214,573 B2
(45) Date of Patent: Feb. 4, 2025

(54) GAS BARRIER LAMINATE AND PACKAGING MATERIAL USING THE SAME

(71) Applicant: TOPPAN INC., Tokyo (JP)

(72) Inventor: Ayumi Tanaka, Tokyo (JP)

(73) Assignee: TOPPAN INC., Tokyo (JP)

( * ) Notice: Subject to any disclaimer, the term of this patent is extended or adjusted under 35 U.S.C. 154(b) by 0 days.

(21) Appl. No.: 17/585,817

(22) Filed: Jan. 27, 2022

(65) Prior Publication Data

US 2022/0143960 A1    May 12, 2022

Related U.S. Application Data

(63) Continuation of application No. PCT/JP2020/028924, filed on Jul. 28, 2020.

(30) Foreign Application Priority Data

Jul. 29, 2019   (JP) .................. 2019-138978

(51) Int. Cl.
*B32B 27/08* (2006.01)
*B32B 7/12* (2006.01)
(Continued)

(52) U.S. Cl.
CPC ............ *B32B 27/08* (2013.01); *B32B 7/12* (2013.01); *B32B 27/306* (2013.01); *B32B 27/32* (2013.01); *B65D 65/40* (2013.01); *B65D 65/42* (2013.01); *C23C 14/081* (2013.01); *C23C 14/10* (2013.01); *C23C 14/24* (2013.01); *B32B 2250/03* (2013.01);
(Continued)

(58) Field of Classification Search
None
See application file for complete search history.

(56) References Cited

U.S. PATENT DOCUMENTS 5,766,751 A * 6/1998 Kotani .................. B32B 27/306
428/323
8,124,236 B2   2/2012 Okawara et al.
(Continued)

FOREIGN PATENT DOCUMENTS

EP   3 991 967 A1   5/2022
JP   8-238730 A    9/1996
(Continued)

OTHER PUBLICATIONS

International Searching Authority, "International Search Report," issued in connection with International Patent Application No. PCT/JP2020/028924, dated Sep. 8, 2020, 5 pages.
(Continued)

*Primary Examiner* — Tamra L. Dicus
(74) *Attorney, Agent, or Firm* — Foley & Lardner LLP

(57) ABSTRACT

A gas barrier laminate includes a polypropylene substrate layer; a first polyvinyl alcohol resin layer; and a metal oxide layer, which are laminated in this order, wherein the first polyvinyl alcohol resin layer has a mass per unit area of 0.5 to 2.5 g/m; and, a packaging material includes the above gas barrier laminate and a polypropylene sealant layer disposed on a surface of the gas barrier laminate, wherein a mass ratio of a sum of the polypropylene substrate layer and the polypropylene sealant layer to a total mass of the packaging material is 85 mass % or more.

8 Claims, 5 Drawing Sheets

(51) Int. Cl.
*B32B 27/30* (2006.01)
*B32B 27/32* (2006.01)
*B65D 65/40* (2006.01)
*B65D 65/42* (2006.01)
*C23C 14/08* (2006.01)
*C23C 14/10* (2006.01)
*C23C 14/24* (2006.01)

(52) U.S. Cl.
CPC ..... *B32B 2250/246* (2013.01); *B32B 2255/10* (2013.01); *B32B 2255/20* (2013.01); *B32B 2255/26* (2013.01); *B32B 2307/516* (2013.01); *B32B 2307/538* (2013.01); *B32B 2307/7244* (2013.01); *B32B 2307/732* (2013.01); *B32B 2553/00* (2013.01)

(56) References Cited

U.S. PATENT DOCUMENTS

| | | | | |
|---|---|---|---|---|
| 9,221,956 | B2* | 12/2015 | Illsley | B65D 65/40 |
| 2002/0182426 | A1 | 12/2002 | Tanaka et al. | |
| 2008/0262179 | A1* | 10/2008 | Nakamura | C08J 7/0427 |
| | | | | 526/240 |
| 2008/0281045 | A1 | 11/2008 | Zhang | |
| 2018/0009206 | A1 | 1/2018 | Murase et al. | |
| 2018/0079188 | A1 | 3/2018 | Grefenstein et al. | |
| 2018/0170017 | A1 | 6/2018 | Ettridge et al. | |
| 2019/0240956 | A1* | 8/2019 | Takasugi | B65D 65/40 |
| 2019/0270288 | A1 | 9/2019 | Dabadie et al. | |
| 2019/0300669 | A1* | 10/2019 | Nishikawa | C09D 5/002 |

FOREIGN PATENT DOCUMENTS

| | | | |
|---|---|---|---|
| JP | H09-201897 A | | 8/1997 |
| JP | 2000-71395 A | | 3/2000 |
| JP | 2000-218726 A | | 8/2000 |
| JP | 2000-297359 A | | 10/2000 |
| JP | 2002-307628 A | | 10/2002 |
| JP | 2005-088415 A | | 4/2005 |
| JP | 2006-056927 A | | 3/2006 |
| JP | 2008-142941 A | | 6/2008 |
| JP | 2010-000605 A | | 1/2010 |
| JP | 2010-527388 A | | 8/2010 |
| JP | 2017-178357 A | | 10/2017 |
| JP | 2018-511497 A | | 4/2018 |
| KR | 20150135200 | * | 12/2015 |
| WO | WO-2016/158794 A1 | | 10/2016 |
| WO | WO-2017/005597 A | | 1/2017 |
| WO | WO-2018/107177 A | | 6/2018 |

OTHER PUBLICATIONS

International Searching Authority, "Written Opinion," issued in connection with International Patent Application No. PCT/JP2020/028924, dated Sep. 8, 2020, 4 pages.

Extended European Search Report issued in connection with EP Appl. Ser. No. 20847789.3 dated Jul. 15, 2022 (6 pages).

Observations by a Third Party issued in connection with EP Appl. No. 20847789.3 dated Aug. 2, 2023.

Matsumoto et al., "Condensability of ethylene-vinyl alcohol copolymer", Polymer Chemistry, vol. 28, No. 315, Jul. 1971, pp. 610-617.

Office Action issued in corresponding Japanese Patent Application No. 2023-062368 dated Oct. 16, 2023 (23 pages).

SoarnoL™ D2908, "Polystyrene-vinyl alcohol copolymer resin (EVOH) 29mol% Ethylene Content", Technical Data Sheet, revised Jul. 1, 2022, pp. 1-3.

SoarnoL™ DT2904RB, "Polystyrene-vinyl alcohol copolymer resin (EVOH) 29mol% Ethylene Content" Technical Data Sheet, revised Jul. 1, 2022, pp. 1-3.

Yonezu, Kiyoshi, "Effect of solvent and degree of polymerization on the intermolecular formalation rate of ethylene—vinyl alcohol co-coalescence", Polymer Chemistry, vol. 52, No. 11, Nov. 1995, pp. 698-702.

Submission of Publications issued in corresponding Japanese Patent Application No. 2023-062368 dated Nov. 24, 2023 (6 pages).

Office Action issued in corresponding Chinese Patent Application No. 202080051696.4 dated Oct. 18, 2023 (14 pages).

Notice of Opposition issued in corresponding Japanese Patent Opposition No. 2023-701094 dated Nov. 28, 2023 (40 pages).

Office Action issued in corresponding Japanese Patent Application No. 2023-062368 dated Feb. 6, 2024 (11 pages).

* cited by examiner

GAS BARRIER LAMINATE AND PACKAGING MATERIAL USING THE SAME

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2020/028924, filed on Jul. 28, 2020, which is based upon and claims the benefit of priority to Japanese Patent Application No. 2019-138978, filed on Jul. 29, 2019; the disclosures of which are incorporated herein by reference in their entirety.

TECHNICAL FIELD

The present disclosure relates to a gas barrier laminate and a packaging material using the same.

BACKGROUND

There have been known laminates (soft packaging materials) having a base film made of a biaxially stretched PET (polyethylene terephthalate) film which is excellent in thermal stability and toughness, and a sealant layer made of a polyolefin film such as polyethylene or polypropylene (for example, PTL 1).
[Citation List] [Patent Literature] PTL 1: JP 2017-178357 A.

SUMMARY OF THE INVENTION

Technical Problem

In recent years, due to the growth in environmental awareness triggered by issues of marine plastic waste and the like, it is required to increase the efficiency in sorting, collecting, and recycling plastic materials. That is, soft packaging materials, which have been developed by combining various different materials to improve performance, are also required to be mono-materials.

The present disclosure provides a gas barrier laminate that is useful for imparting high recyclability to packaging materials and has high gas barrier properties. The present disclosure provides a packaging material using the gas barrier laminate.

Solution to Problem

A gas barrier laminate according to an aspect of the present disclosure includes: a polypropylene substrate layer; a first polyvinyl alcohol resin layer; and a metal oxide layer, which are laminated in this order, wherein the first polyvinyl alcohol resin layer has a mass per unit area of 0.5 to 2.5 g/m². According to the above gas barrier laminate, in which the first polyvinyl alcohol resin layer is interposed between the polypropylene substrate layer and the metal oxide layer, high gas barrier properties can be achieved even when a surface of the polypropylene substrate layer is not necessarily highly smooth. From the viewpoint of obtaining improved gas barrier properties, a surface roughness Sa of the first polyvinyl alcohol resin layer is preferably 0.2 μm or less, and more preferably 0.1 μm or less.

The present inventors have worked to develop a gas barrier laminate, which is used together with a sealant layer to form a packaging material, capable of producing mono-material packaging materials having high recyclability. In order to produce mono-material packaging materials in which a non-stretched polypropylene film (CPP film) which is common as a sealant film is used, a gas barrier laminate is required to include a polypropylene film (PP film) as a substrate layer. However, considering thermal stability of the packaging material, this does not mean any type of PP film can be used, and it is useful to use a propylene monopolymer film having high thermal stability compared with other PP films. Packaging materials with food content therein may be subjected to heat sterilization treatments such as boiling treatment or retort treatment, so they may be required to have thermal stability.

According to the evaluation test performed by the present inventors, propylene monopolymer films have a drawback that the film surface tends to become a vein-like surface, which hinders sufficient barrier properties being achieved even when a metal oxide layer (gas barrier layer) is formed directly on a surface of the propylene monopolymer film. The present inventors developed a gas barrier laminate useful to provide mono-material packaging materials having high gas barrier properties by providing a polyvinyl alcohol resin layer interposed between the propylene monopolymer film as a substrate layer and a metal oxide layer.

From the viewpoint of imparting high thermal stability to the gas barrier laminate, the polypropylene substrate layer is preferably a propylene monopolymer layer as described above.

The gas barrier laminate according to the present disclosure further includes: a second polyvinyl alcohol resin layer that cooperates with the first polyvinyl alcohol resin layer to sandwich the metal oxide layer therebetween. Due to the configuration in which the metal oxide layer is sandwiched between the first and second polyvinyl alcohol resin layers, further improved gas barrier properties can be achieved. From the viewpoint of ensuring adhesion to the metal oxide layer and maintaining gas barrier properties, the second polyvinyl alcohol resin layer may contain a silane compound. The mass ratio of the silane compound relative to the mass of the second polyvinyl alcohol resin layer may be, for example, 0.05 to 0.95.

A packaging material according to another aspect of the present disclosure includes: the above gas barrier laminate, and a polypropylene sealant layer disposed on a surface of the gas barrier laminate, wherein a mass ratio of a sum of the polypropylene substrate layer and the polypropylene sealant layer to a total mass of the packaging material is 85 mass % or more, and may be 90 mass % or more, or may be 95 mass % or more depending on the thickness of the polypropylene sealant layer. According to the above packaging material, in which the gas barrier laminate described above is used together with the polypropylene sealant layer, a mono-material packaging material can be provided. In the present disclosure, a mono-material packaging material refers to a packaging material in which a mass ratio of a specific material (polypropylene material) is 85 mass % or more (preferably 90 mass % or more, or 95 mass % or more).

Advantageous Effects of Invention

According to the present disclosure, a gas barrier laminate that is useful for imparting high recyclability to packaging materials and has high gas barrier properties is provided. According to the present disclosure, a packaging material using the gas barrier laminate is provided.

DETAILED DESCRIPTION

Embodiments of the present invention will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention. For the sake of clarity, the drawings may be illustrated in an exaggerated manner as appropriate.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

<Gas Barrier Laminate>

Figure 1:
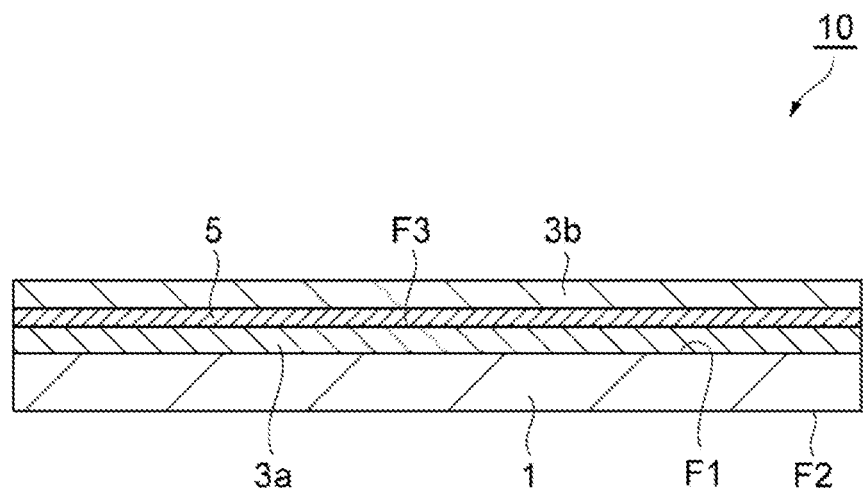
FIG. 1 is a cross-sectional view schematically illustrating an embodiment of a gas barrier laminate according to the present disclosure.

FIG. 1 is a schematic cross-sectional view illustrating a gas barrier laminate according to the present embodiment. A gas barrier laminate 10 shown in FIG. 1 has a laminate structure in which a substrate layer 1, a first polyvinyl alcohol resin layer 3a, a metal oxide layer 5, and a second polyvinyl alcohol resin layer 3b are laminated in this order.

(Substrate Layer)

The substrate layer 1 is made of a polypropylene resin. Examples of the polypropylene resin include homopolymers, random copolymers, and block copolymers of propylene. When the substrate layer 1 is required to have thermal stability, the polypropylene resin is preferably a propylene homopolymer. However, a propylene homopolymer film has a drawback that the film surface tends to become a vein-like surface as described above. The vein-like film surface may have a surface roughness Sa of more than 0.2 μm, for example. The surface roughness Sa may also be 0.21 to 0.5 μm.

In the present disclosure, the surface roughness Sa of each layer is a value measured using a three-dimensional non-contact surface shape measurement system (Vertscan R3300h Lite, manufactured by Ryoka System Inc.) under the following conditions.

Measurement mode: Phase
Scan speed: 4 μm/sec
Scan range: 10/−20 μm
Number of scans: 1 scan
Interpolation: Full interpolation
Surface correction: Fourth order
Barrel lens: 1×
Objective lens: 5×

Due to the substrate layer 1 being made of a propylene homopolymer film, the gas barrier laminate 10 can withstand heat sterilization treatments such as boiling treatment and retort treatment. The temperature of boiling treatment is approximately 60 to 100° C., and the temperature of retort treatment is approximately 105 to 140° C.

The film constituting the substrate layer 1 may be a stretched film or a non-stretched film. However, in view of impact resistance, thermal stability, water resistance, dimensional stability, and the like, the film constituting the substrate layer 1 may be a stretched film. The stretching method is not specifically limited, and the film may be stretched by any method, such as inflation, uniaxial stretching, or biaxial stretching, as long as a dimensionally stable film can be supplied.

Figure 2A:
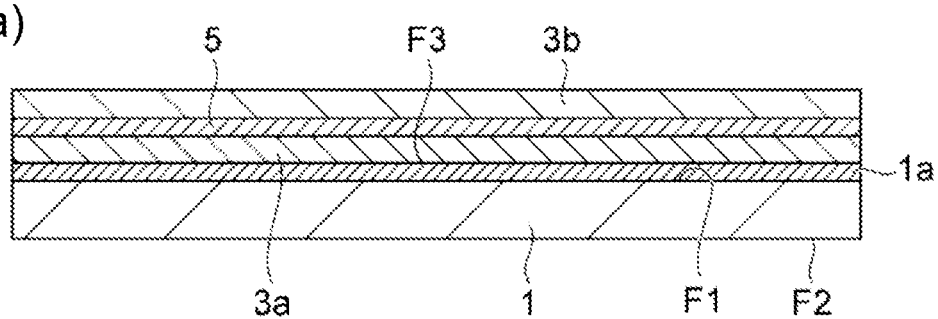
FIGS. 2(a) and 2(b) are cross-sectional views schematically illustrating modified examples of the gas barrier laminate shown in FIG. 1.
Figure 2B:
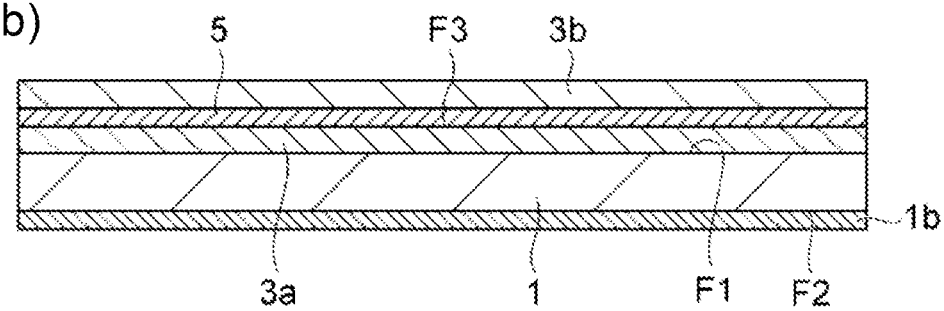

The thickness of the substrate layer 1 is not specifically limited. From the viewpoint of obtaining high impact resistance and high gas barrier properties, the thickness may be 10 to 100 μm, and preferably 15 to 30 μm. A laminate surface F1 of the film constituting the substrate layer 1 may be subjected to various pretreatments such as corona treatment, plasma treatment, and flame treatment to a degree that the barrier properties are not impaired, or may be provided with a coat layer 1a (adhesion layer) to improve adhesion (see FIG. 2(a)). Further, an outer surface F2 of the substrate layer 1 may be provided with a copolymer layer 1b. Specific examples of the resin constituting a polymer layer 1b include copolymers of propylene and a monomer other than propylene. Examples of such a monomer may be at least one of ethylene and butene.

The polypropylene resin constituting the substrate layer 1 may contain, if necessary, additives such as an antistatic agent, a UV absorber, a plasticizer, and a slip agent. Further, in order to provide a gas barrier laminate 10 and a mono-material packaging material 50 using the same with high reliability, a mass ratio of the polypropylene resin to the substrate layer 1 is preferably 90 mass % or more, and more preferably 95 mass % or more.

(First Polyvinyl Alcohol Resin Layer)

The resin constituting the first polyvinyl alcohol resin layer 3a may be one having vinyl alcohol units obtained by saponifying vinyl ester units. For example, polyvinyl alcohol (PVA) or ethylene-vinyl alcohol copolymer (EVOH) can be used. From the viewpoint of thermal stability and gas barrier properties, EVOH can be favorably used.

Examples of PVA include resins obtained by polymerizing a vinyl ester alone, such as vinyl acetate, vinyl formate, vinyl propionate, vinyl valerate, vinyl caprate, vinyl laurate, vinyl stearate, vinyl pivalate, or vinyl versatate, and then saponifying the polymerized product.

The PVA may also be a modified PVA obtained by copolymerization modification or post-modification. The copolymerized modified PVA may be obtained by, for example, copolymerizing a vinyl ester and an unsaturated monomer copolymerizable with the vinyl ester, and then saponifying the polymerized product. The post-modified PVA may be obtained by copolymerizing a PVA which has been obtained by saponifying a vinyl ester with an unsaturated monomer in the presence of a polymerization catalyst. The degree of modification of the modified PVA can be less than 50 mol % from the viewpoint of obtaining sufficient gas barrier properties, and may be 10 mol % or more from the viewpoint of obtaining the effect of modification.

Examples of the above unsaturated monomer include: olefins such as ethylene, propylene, isobutylene, α-octene, α-dodecene, and α-octadecene; hydroxy group-containing α-olefins such as 3-buten-1-ol, 4-pentyn-1-ol, and 5-hexen-1-ol; unsaturated acids such as acrylic acid, methacrylic acid, crotonic acid, maleic acid, maleic anhydride, itaconic acid, and undecylenic acid; nitriles such as acrylonitrile and methacrylonitrile; amides such as diacetone acrylamide, acrylamide, and methacrylamide; olefin sulfonic acids such as ethylene sulfonic acid, allyl sulfonic acid, and methallyl sulfonic acid; vinyl compounds such as alkyl vinyl ether, dimethyl allyl vinyl ketone, N-vinylpyrrolidone, vinyl chloride, vinyl ethylene carbonate, 2,2-dialkyl-4-vinyl-1,3-dioxolane, glycerin monoallyl ether, and 3,4-diacetoxy-1-butene; vinylidene chloride, 1,4-diacetoxy-2-butene, vinylene carbonate, polyoxypropylene, and polyoxypropylene vinyl amine. From the viewpoint of gas barrier properties, the unsaturated monomer may be an olefin, and may be particularly ethylene.

Examples of the polymerization catalyst include radical polymerization catalysts such as azobisisobutyronitrile, benzoyl peroxide, and lauryl peroxide. The polymerization method is not specifically limited, and bulk polymerization, emulsion polymerization, solvent polymerization, and the like can be used.

The degree of polymerization of PVA is preferably 300 to 3000. When the degree of polymerization is lower than 300, the barrier properties tend to decrease. When the degree of polymerization is over 3000, coating suitability tends to decrease due to the viscosity being too high. The degree of saponification of PVA is preferably 80 mol % or more, more preferably 90 mol % or more, and still more preferably 99 mol % or more. Further, the degree of saponification of PVA may be 100 mol % or less, or may also be 99.9 mol % or less. The degree of polymerization and degree of saponification of PVA can be determined according to the method described in JIS K 6726 (1994).

In general, EVOH is obtained by saponifying a copolymer of ethylene and an acid vinyl ester such as vinyl acetate, vinyl formate, vinyl propionate, vinyl valerate, vinyl caprate, vinyl laurate, vinyl stearate, vinyl pivalate, or vinyl versatate.

The degree of polymerization of EVOH is preferably 300 to 3000. When the degree of polymerization is lower than 300, the barrier properties tend to decrease. When the degree of polymerization is over 3000, coating suitability tends to decrease due to the viscosity being too high. The degree of saponification of the vinyl ester component of EVOH is preferably 80 mol % or more, more preferably 90 mol % or more, and still more preferably 99 mol % or more. Further, the degree of saponification of EVOH may be 100 mol % or less, or may also be 99.9 mol % or less. The degree of saponification of EVOH is determined from the peak area of hydrogen atoms in the vinyl ester structure and the peak area of hydrogen atoms in the vinyl alcohol structure by performing nuclear magnetic resonance (1H-NMR) measurement.

The ethylene unit content of EVOH may be, for example, 10 mol % or more, preferably 15 mol % or more, more preferably 20 mol % or more, and still more preferably 25 mol % or more. Further, the ethylene unit content of EVOH is preferably 65 mol % or less, more preferably 55 mol % or less, and still more preferably 50 mol % or less. The ethylene unit content of 10 mol % or more enables to maintain good gas barrier properties or dimensional stability under high humidity. On the other hand, the ethylene unit content of 65 mol % or less can enhance gas barrier properties. The ethylene unit content of EVOH can be calculated by a NMR method.

Saponification can be carried out with an alkali or acid. From the viewpoint of saponification rate, an alkali can be used. Examples of the alkali include alkali metal oxides such as sodium hydroxide and potassium hydroxide, and alkali metal alkoxides such as sodium ethylate, potassium ethylate and lithium methylate.

The first polyvinyl alcohol resin layer 3a has a mass per unit area of 0.5 to 2.5 g/m$^2$. The mass may also be 0.5 to 2.0 g/m$^2$ or 0.5 to 1.5 g/m$^2$. A mass of 0.5 g/m$^2$ or more can ensure sufficient smoothness for the surface F3 of the first polyvinyl alcohol resin layer 3a even when the laminate surface F1 of the substrate layer 1 has insufficient smoothness. Accordingly, a metal oxide layer 5 having good gas barrier properties can be formed on the surface F3. On the other hand, a mass of 2.5 g/m$^2$ or less is advantageous in obtaining a mono-material polypropylene resin and reducing the material cost. In addition, the first polyvinyl alcohol resin layer 3a may have a thickness of 0.4 to 2.0 μm, for example, from the same viewpoint as for the mass per unit area described above. The thickness may also be 0.4 to 1.7 μm or 0.4 to 1.3 μm. The thickness of the resin layer can be calculated based on the mass per unit area of the resin layer and the density of the resin.

The surface F3 of the first polyvinyl alcohol resin layer 3a may have a surface roughness Sa of 0.2 μm or less, for example. The surface roughness Sa may also be 0.01 to 0.1 μm or 0.02 to 0.1 μm. The surface F3 with the surface roughness Sa of 0.2 μm or less enables formation of the metal oxide layer 5 having good gas barrier properties on the surface F3. On the other hand, the surface F3 with the surface roughness Sa of 0.01 μm or more can improve adhesion between the first polyvinyl alcohol resin layer 3a and the metal oxide layer 5 due to an anchoring effect, compared with a case where the surface roughness Sa is less than 0.01 μm.

(Metal Oxide Layer)

The metal oxide layer 5 has gas barrier properties. Examples of metal oxides include silicon oxide (SiOx), aluminum oxide (AlOx), and the like. By using these metal oxides, high gas barrier properties can be obtained while reducing the thickness. The metal oxide layer 5 may be made of a silicon oxide from the viewpoint of exhibiting high tensile stretchability during processing.

The metal oxide layer 5 may have a thickness of 5 to 100 nm, for example. The thickness may also be 10 to 50 nm or 20 to 40 nm. The thickness of the metal oxide layer 5 of 5 nm or more can provide sufficient gas barrier properties. On the other hand, the thickness of 100 nm or less can reduce occurrence of cracking caused by deformation due to internal stress of the metal oxide layer 5, which makes it possible to maintain high gas barrier properties.

(Second Polyvinyl Alcohol Resin Layer)

As for the polyvinyl alcohol resin constituting the second polyvinyl alcohol resin layer 3b, the description regarding the first polyvinyl alcohol resin layer 3a can be referred to.

The second polyvinyl alcohol resin layer 3b may include a silane compound. Examples of the silane compound include tetraalkoxysilanes such as tetramethoxy silane and tetraethoxysilane, reactive group-containing trialkoxysilanes such as glycidoxypropyl trimethoxy silane and acryloxypropyl trimethoxy silane, silazanes such as hexamethyldisilazane, and the like. As the silane compound, a compound commonly used as a silane coupling agent or a polysiloxane compound having a siloxane bond may be used.

The mass ratio of the above silane compound relative to the mass of the second polyvinyl alcohol resin layer 3b may be 0.05 to 0.95, for example, from the viewpoint of adhesion to the metal oxide layer and maintaining gas barrier properties. The mass ratio may also be 0.1 to 0.8 or 0.3 to 0.7.

The second polyvinyl alcohol resin layer 3b may have a thickness of 0.1 to 1.0 μm, for example. The thickness may also be 0.1 to 0.8 μm or 0.2 to 0.7 μm. The thickness of 0.1 μm or more can provide high gas barrier properties, and maintain such gas barrier properties for a sufficiently long period of time. On the other hand, the thickness of 1.0 μm or less is advantageous in obtaining a mono-material polypropylene resin and reducing the material cost.

<Method of Producing Gas Barrier Laminate>

The gas barrier laminate 10 is produced by the steps of, for example, forming a first polyvinyl alcohol resin layer 3a on the substrate layer 1, forming a metal oxide layer 5 on the first polyvinyl alcohol resin layer 3a, and forming a second polyvinyl alcohol resin layer 3b on the metal oxide layer 5.

(Step of Forming First Polyvinyl Alcohol Resin Layer)

In this step, a coating solution containing a polyvinyl alcohol resin and a liquid medium can be used. The coating solution can be obtained by, for example, dissolving a synthetic polyvinyl alcohol resin powder in a liquid medium. Examples of the liquid medium include water, dimethylsulfoxide, dimethylformamide, dimethylacetamide, N-methylpyrrolidone, various glycols, polyvalent alcohols such as trimethylolpropane, and amines such as ethylenediamine and diethylenetriamine. These may be used singly or in combination of two or more. From the viewpoint of reducing environmental burden and the like, water can be used as a liquid medium. In this case, a coating solution can be obtained by dissolving a polyvinyl alcohol resin powder in water at a high temperature (for example, 80° C.).

The content of polyvinyl alcohol resin (solid content) in the coating solution can be 3 to 20 mass % from the viewpoint of maintaining good coating properties. The coating solution may contain an additive such as an isocyanate or polyethyleneimine for improving adhesion. The coating solution may further contain additives such as a preservative, a plasticizer (e.g., alcohol), and a surfactant.

The coating solution can be applied to the substrate layer 1 by a suitable method. For example, the coating solution can be applied by a wet film formation method using a gravure coater, a dip coater, a reverse coater, a wire bar coater, a die coater, or the like. The coating temperature and the drying temperature of the coating solution are not specifically limited, and may be, for example, 50° C. or higher.

The first polyvinyl alcohol resin layer 3a may be formed on the substrate layer 1 by an extrusion method. In this case, multilayer extrusion using a T-die can be used. An adhesive that can be used in extrusion may be, for example, a two-part curing type polyurethane adhesive prepared by reacting a curing agent made of a bifunctional or higher functional aromatic or aliphatic isocyanate compound with a base resin such as polyester polyol, polyether polyol, or acrylic polyol. The above adhesive component may be applied to the substrate layer 1 and dried to form an adhesive layer on the substrate layer 1 in advance. When a polyurethane adhesive is used, it is aged, for example, at 40° C. for 4 days or longer after coating to allow a reaction between the hydroxyl group of the base resin and the isocyanate group of the base resin to proceed, which enables strong adhesion. From the viewpoint of adhesion, conformability, processability, and the like, the thickness of the adhesive layer may be 1 to 50 μm, and preferably 3 to 20 μm.

(Step of Forming Metal Oxide Layer)

The metal oxide layer 5 can be formed by, for example, vacuum deposition. The vacuum deposition can be performed as physical vapor deposition or chemical vapor deposition. Examples of the physical vapor deposition include, but are not limited to, vacuum vapor deposition, sputtering, and ion plating. Examples of the chemical vapor deposition include, but are not limited to, thermal CVD, plasma CVD, and photo CVD.

Specifically, resistance heating vacuum vapor deposition, electron beam (EB) heating vacuum vapor deposition, induction heating vacuum vapor deposition, sputtering, reactive sputtering, dual magnetron sputtering, plasma-enhanced chemical vapor deposition (PECVD), and the like are preferably used for the vacuum deposition. In view of productivity, the vacuum vapor deposition is currently most preferable. As a heating means for the vacuum vapor deposition, it is preferred to use one of electron beam heating, resistive heating, and inductive heating.

In sputtering, in which a target at the cathode has a negative potential gradient, the potential energy causes $Ar^+$ ions to collide with the target. Here, even when plasma is generated, sputtering cannot be performed unless a negative self-bias potential is generated. Therefore, microwave (MW) plasma, which does not produce a self-bias, is not suitable for sputtering. On the other hand, in PECVD, in which a gas phase reaction in plasma is used to progress chemical reaction and deposition, and a film can be formed without self-bias, MW plasma can be used.

(Step of Forming Second Polyvinyl Alcohol Resin Layer)

In this step, a coating solution can be used as in the step of forming a first polyvinyl alcohol resin layer 3a. As for the coating solution, the description given in the step of forming a first polyvinyl alcohol resin layer 3a can be referred to.

The coating solution for forming a second polyvinyl alcohol resin layer 3b may include a silane compound. The silane compound content in the coating solution can be adjusted so that a desired amount of the silane compound is included in the second polyvinyl alcohol resin layer 3b. When a silane compound is included in the coating solution, the coating solution may further include an acid catalyst, an alkali catalyst, a photopolymerization initiator, and the like.

<Packaging Material>

Figure 3:
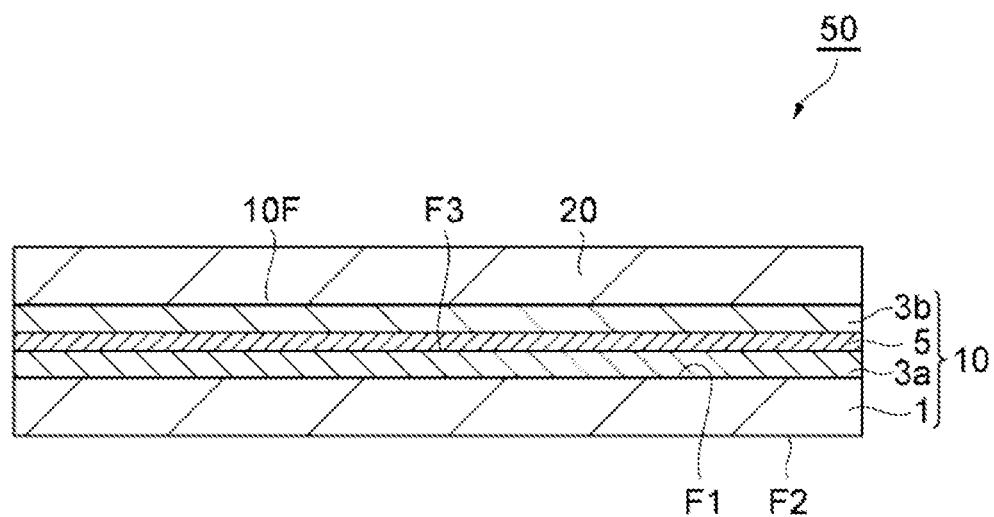
FIG. 3 is a cross-sectional view schematically illustrating a packaging material using the gas barrier laminate shown in FIG. 1.

The packaging material 50 shown in FIG. 3 includes the gas barrier laminate 10, and a polypropylene sealant layer 20 disposed on an inner surface 10F of the gas barrier laminate 10. The mass ratio of the substrate layer 1 and the polypropylene sealant layer 20 relative to the total mass of the packaging material 50 is 85 mass % or more (preferably, 90 mass % or more, or 95 mass % or more), by which a mono-material packaging material 50 is provided.

The gas barrier laminate 10 may be bonded to the polypropylene sealant layer 20 using, for example, an adhesive (not shown). For example, an adhesive containing linear low-density polyethylene (LLDPE), polyurethane, polypropylene, an ethylene-unsaturated ester copolymer resin, a polyester copolymer resin, or the like can be used. The adhesive layer may have a thickness of, for example, approximately 1 to 5 µm. Specific examples of the polypropylene sealant layer 20 may include, for example, an unstretched polypropylene film (CPP film). The polypropylene sealant layer 20 may have a thickness of, for example, 10 to 100 µm.

Figure 4:
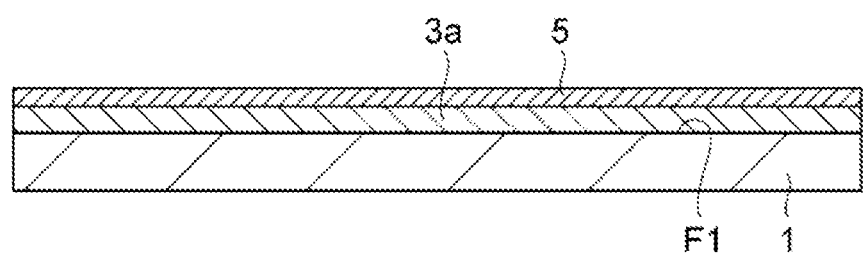
FIG. 4 is a cross-sectional view schematically illustrating another embodiment of a gas barrier laminate according to the present disclosure.

While the embodiment of the present disclosure has been described, the present invention is not limited to the above embodiment. For example, in the example described in the above embodiment, the gas barrier laminate 10 includes the second polyvinyl alcohol resin layer 3b. However, the second polyvinyl alcohol resin layer 3b may not be necessarily provided depending on the application of the gas barrier laminate (see FIG. 4).

Figure 5:
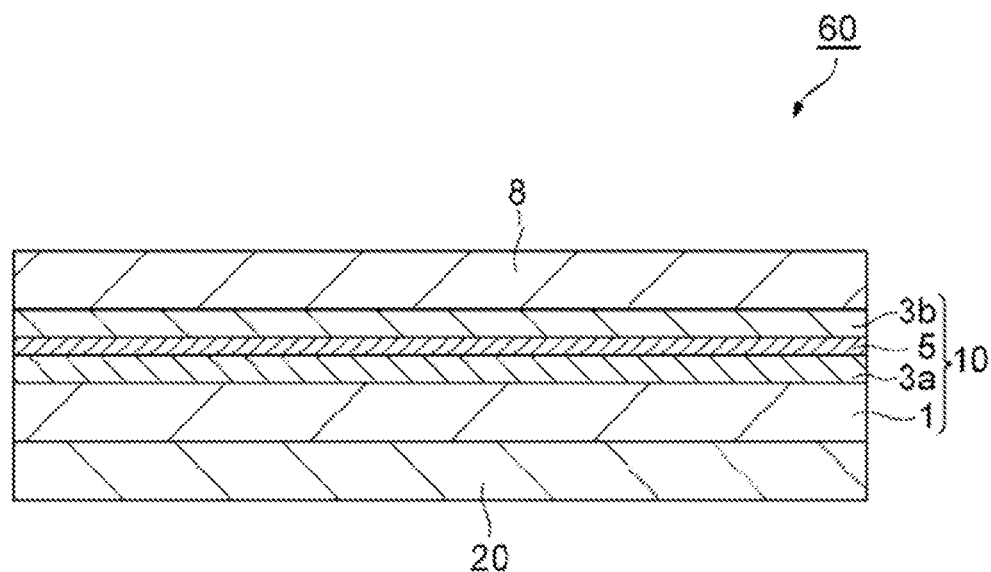
FIG. 5 is a cross-sectional view schematically illustrating another embodiment of a packaging material according to the present disclosure.

In the example described in the above embodiment, the packaging material 50 includes the polypropylene sealant layer 20 bonded to a barrier surface of the gas barrier laminate 10. However, the polypropylene sealant layer 20 may also be bonded to a side of the substrate layer 1 of the gas barrier laminate 10 (see FIG. 5). A packaging material 60 shown in FIG. 5 has a configuration in which a barrier surface of the gas barrier laminate 10 faces a general OPP film 8 (e.g., print substrate), and the polypropylene sealant layer 20 is bonded to a side of the substrate layer 1 of the gas barrier laminate 10.

EXAMPLES

In the following description, the present disclosure will be described in more detail by way of examples. However, the present invention should not be limited to these examples.

The following materials were prepared for the examples and comparative examples.

(Substrate Layer)
  Polypropylene resin: Propylene monopolymer (mono PP)
(Polyvinyl Alcohol Resin Layer)
  EVOH: EVAL L171B (manufactured by Kuraray Co., Ltd.)
  PVA: POVAL 60-98 (manufactured by Kuraray Co., Ltd.)
  TEOS: KBE04 (manufactured by Shin-Etsu Chemical Co., Ltd.)
(Sealant Layer)
  Polypropylene sealant film: TORAYFAN ZK207#60 (CPP, thickness 60 µm, Toray Industries, Inc.)

Example 1

An OPP film (substrate layer) was prepared using the above mono PP, and an EVOH layer (first polyvinyl alcohol resin layer) was formed on a surface of the OPP film by extrusion. The EVOH layer had a mass per unit area of 0.97 g/m². The EVOH layer had a thickness of 0.8 µm and a surface roughness Sa of 0.08 µm. The EVOH layer was removed to measure the surface roughness Sa of the OPP film. The value measured was 0.23 µm. The surface roughness Sa was measured using a three-dimensional non-contact surface shape measurement system (Vertscan R3300h Lite, manufactured by Ryoka System Inc.) under the conditions described above.

A SiOx film (metal oxide layer) was formed on a surface of the EVOH layer using an electron beam heating vacuum deposition apparatus. That is, a SiO deposition material was evaporated by electron beam heating to form a SiOx film (50 nm thickness). Then, a layer containing PVA and TEOS (second polyvinyl alcohol resin layer) was formed on a surface of the SiOx film. That is, TEOS, methanol, and hydrochloric acid (0.1N) were mixed at a mass ratio of 18/10/72 to obtain a hydrolyzed solution (TEOS-containing solution). A coating solution was prepared by mixing a 5% aqueous solution of PVA and a TEOS-containing solution at a mass ratio between PVA and TEOS of 50/50. After the coating solution was applied to a surface of the SiOx film, the coating solution was dried to form a layer containing PVA and TEOS (PVA/TEOS=50/50).

A polypropylene sealant film was bonded to an inner surface of the gas barrier laminate obtained by the above steps via an adhesive (A-525, manufactured by Mitsui Chemicals, Inc.). Thus, a packaging material was produced. The polypropylene resin of the packaging material had a mass ratio of 94 mass %. The oxygen permeability of the packaging material was measured. The measurement of oxygen permeability was performed using an OX-TRAN2/20 (manufactured by MOCON Inc.) according to JIS K 7126-2 under the conditions of temperature 30° C. and relative humidity 70%. Further, the oxygen permeability of the packaging material after boiling treatment was also measured in the same manner. That is, a three side seal pouch was formed using the packaging material, and then tap water was sealed in the pouch. After the sealed body was boiled for 30 minutes under the temperature condition of 90° C., the oxygen permeability of the packaging material was measured. The result is shown in Table 1.

Example 2

A gas barrier laminate and a packaging material were produced in the same manner as in Example 1 except that an AlOx film (50 nm) was formed instead of the SiOx film (50 nm) as the metal oxide layer, and evaluation was performed. The AlOx film was formed by evaporating aluminum ingots using electron beam heating, and introducing oxygen. The result is shown in Table 1.

Example 3

A gas barrier laminate and a packaging material were produced in the same manner as in Example 1 except that a layer of PVA and TEOS at a mass ratio of 97/3 was formed instead of a layer of PVA and TEOS at a mass ratio of 50/50, and evaluation was performed. The result is shown in Table 1.

Comparative Example 1

A gas barrier laminate and a packaging material were produced in the same manner as in Example 1 except that a layer of PVA and TEOS at a mass ratio of 50/50 was not formed and a SiOx film (50 nm) was formed directly on a surface of the OPP film, and evaluation was performed. The result is shown in Table 2.

Comparative Example 2

A gas barrier laminate and a packaging material were produced in the same manner as in Example 1 except that a PVA layer (mass per unit area 2.8 g/m², thickness 2.3 µm) was formed instead of an EVOH layer (mass per unit area 0.97 g/m², thickness 0.8 μm) as the first polyvinyl alcohol resin layer, and evaluation was performed. The result is shown in Table 2.

Comparative Example 3

A gas barrier laminate and a packaging material were produced in the same manner as in Example 1 except that an EVOH layer (mass per unit area 0.40 g/m², thickness 0.33 μm) was formed instead of an EVOH layer (mass per unit area 0.97 g/m², thickness 0.8 μm) as the first polyvinyl alcohol resin layer, and evaluation was performed. The result is shown in Table 2.

INDUSTRIAL APPLICABILITY

According to the present disclosure, a gas barrier laminate that is useful for imparting high recyclability to packaging materials and has high gas barrier properties is provided. According to the present disclosure, a packaging material using the gas barrier laminate is provided.

REFERENCE SIGNS LIST

1 . . . Substrate layer; 1a . . . Coat layer (adhesion layer); 1b . . . Copolymer layer; 3a . . . First polyvinyl alcohol resin layer; 3b . . . Second polyvinyl alcohol resin layer; 5 . . .

TABLE 1

|  |  | Example 1 | Example 2 | Example 3 |
|---|---|---|---|---|
| Substrate layer | Material | OPP | OPP | OPP |
|  | Thickness (μm) | 19.2 | 19.2 | 19.2 |
|  | Surface roughness Sa (μm) | 0.23 | 0.23 | 0.23 |
| First polyvinyl alcohol resin layer | Material | EVOH | EVOH | EVOH |
|  | Mass per unit area (g/m²) | 0.97 | 0.97 | 0.97 |
|  | Thickness (μm) | 0.8 | 0.8 | 0.8 |
|  | Surface roughness Sa (μm) | 0.08 | 0.08 | 0.08 |
| Metal oxide layer | Material | SiOx | AlOx | SiOx |
|  | Thickness (nm) | 50 | 50 | 50 |
| Second polyvinyl alcohol resin layer | Material | PVA/TEOS = 50/50 | PVA/TEOS = 50/50 | PVA/TEOS = 97/3 |
|  | Thickness (μm) | 0.5 | 0.5 | 0.5 |
| Sealant layer | Material | CPP | CPP | CPP |
|  | Thickness (μm) | 60 | 60 | 60 |
| Mass ratio of polypropylene resin of packaging material (mass %) |  | 94 | 94 | 94 |
| Oxygen permeability (cc/m² · day · atm) | Before boiling treatment | 0.05 | 0.2 | 0.1 |
|  | After boiling treatment | 0.5 | 0.8 | 5.8 |

TABLE 2

|  |  | Comparative example 1 | Comparative example 2 | Comparative example 3 |
|---|---|---|---|---|
| Substrate layer | Material | OPP | OPP | OPP |
|  | Thickness (μm) | 19.2 | 19.2 | 19.2 |
|  | Surface roughness Sa (μm) | 0.23 | 0.23 | 0.23 |
| First polyvinyl alcohol resin layer | Material | EVOH | PVA | EVOH |
|  | Mass per unit area (g/m²) | — | 2.8 | 0.40 |
|  | Thickness (μm) | — | 2.3 | 0.33 |
|  | Surface roughness Sa (μm) | — | 0.32 | 0.08 |
| Metal oxide layer | Material | SiOx | SiOx | SiOx |
|  | Thickness (nm) | 50 | 50 | 50 |
| Second polyvinyl alcohol resin layer | Material | PVA/TEOS = 50/50 | PVA/TEOS = 50/50 | PVA/TEOS = 50/50 |
|  | Thickness (μm) | 0.5 | 0.5 | 0.5 |
| Sealant layer | Material | CPP | CPP | CPP |
|  | Thickness (μm) | 60 | 60 | 60 |
| Mass ratio of polypropylene resin of packaging material (mass %) |  | 95 | 91 | 94 |
| Oxygen permeability (cc/m² · day · atm) | Before boiling treatment | 30 | 6.3 | 10.4 |
|  | After boiling treatment | 200 | 100 | 48.7 |

Metal oxide layer; 10 . . . Gas barrier laminate; 10F . . . Inner surface; 20 . . . Polypropylene sealant layer; 50, 60 . . . Packaging material; F1 . . . Laminate surface of polypropylene substrate layer; F2 . . . Outer surface of polypropylene substrate layer; F3 . . . Surface of first polyvinyl alcohol resin layer.

What is claimed is:

1. A packaging material consisting of:
   a polypropylene substrate layer;
   a first layer consisting essentially of ethylene-vinyl alcohol copolymer, the first layer is directly on the polypropylene substrate layer, the first layer having a mass per unit area of 0.5 to 2.5 g/m$^2$, the first layer is formed on the polypropylene substrate layer by extrusion;
   a metal oxide layer consisting of silicon oxide or aluminum oxide, the metal oxide layer is directly on the first layer;
   a second layer directly on the metal oxide layer, the second layer consists essentially of polyvinyl alcohol and a silane compound;
   an adhesive and
   a polypropylene sealant layer bonded to the second layer via the adhesive, wherein a surface of the first layer in contact with the metal oxide layer has a surface roughness Sa of 0.2 μm or less.

2. The packaging material of claim 1, wherein the surface of the first polyvinyl alcohol resin layer in direct contact with the metal oxide layer has the surface roughness Sa of 0.1 μm or less.

3. The packaging material of claim 1, wherein the polypropylene substrate layer is a propylene monopolymer layer.

4. The packaging material of claim 1, wherein a mass ratio of the silane compound relative to a mass of the second layer is 0.05 to 0.95.

5. The packaging material of claim 1, wherein the second layer has a thickness of 0.1 to 1.0 μm.

6. The packaging material claim 1, wherein the first layer has a thickness of 0.4 to 2.0 μm.

7. The packaging material of claim 1, wherein the metal oxide layer is a vapor deposition layer having a thickness of 5 to 100 nm.

8. The packaging material of claim 1, wherein
   a mass ratio of a sum of the polypropylene substrate layer and the polypropylene sealant layer to a total mass of the packaging material is 85 mass % or more.

\* \* \* \* \*